United States Patent [19]

Kawai et al.

[11] Patent Number: 5,650,712
[45] Date of Patent: Jul. 22, 1997

[54] METHOD FOR DETECTING REMAINING BATTERY CURRENT, VOLTAGE, AND TEMPERATURE CAPACITY BY CONTINUOUSLY MONITORING

[75] Inventors: Toshiyuki Kawai, Toyohashi; Mitsunobu Uchida, Okazaki; Daisuke Makino, Ichinomiya, all of Japan

[73] Assignee: Nippon Soken, Inc., Japan

[21] Appl. No.: 497,763

[22] Filed: Jul. 3, 1995

[30] Foreign Application Priority Data

Jul. 4, 1994 [JP] Japan .................... 6-174834
Apr. 24, 1995 [JP] Japan .................... 7-123096

[51] Int. Cl.$^6$ ............................................... H01M 10/48
[52] U.S. Cl. .......................... 320/48; 429/90; 324/427
[58] Field of Search ............................ 320/5, 13, 22, 320/30, 35, 39, 44, 48; 340/635, 636; 429/61, 90; 324/427, 430, 431, 433

[56] References Cited

U.S. PATENT DOCUMENTS

| | | | |
|---|---|---|---|
| 4,775,827 | 10/1988 | Ijntema et al. | 320/5 X |
| 5,144,218 | 9/1992 | Bosscha | 320/48 X |
| 5,287,286 | 2/1994 | Ninomiya | 320/48 X |
| 5,434,495 | 7/1995 | Toko | 320/44 |
| 5,473,262 | 12/1995 | Yoshimatsu | 320/48 X |

FOREIGN PATENT DOCUMENTS

| | | |
|---|---|---|
| 52-79234 | 7/1977 | Japan . |
| 1-288784 | 11/1989 | Japan . |
| 5-74501 | 3/1993 | Japan . |

*Primary Examiner*—Edward Tso
*Attorney, Agent, or Firm*—Cushman Darby & Cushman IP Group of Pillsbury Madison & Sutro LLP

[57] ABSTRACT

A map charging index representing discharge characteristics of a battery is obtained based on a battery voltage under a predetermined discharging operation. The map charging index indicates 100 at a first battery voltage obtainable immediately after the battery starts the discharging operation from a fully charged condition and also indicates 0 at a second battery voltage obtainable when the battery substantially ceases the discharging operation. An accumulative charging index is calculated by subtracting a charged capacity from a temporary full-charge capacity of the battery. The temporary full-charge capacity is corrected based on a difference between the map charging index and the accumulative charging index, thereby obtaining a corrected full-charge capacity. And, a dischargeable capacity of the battery is calculated by subtracting the discharged capacity from the corrected full-charge capacity.

26 Claims, 10 Drawing Sheets

METHOD FOR DETECTING REMAINING BATTERY CURRENT, VOLTAGE, AND TEMPERATURE CAPACITY BY CONTINUOUSLY MONITORING

BACKGROUND OF THE INVENTION

1. Field of the Invention

This invention relates to a battery charging condition detecting method for accurately detecting a dischargeable or residual capacity of a battery or a degree of deterioration of the same.

2. Prior Art

Of some related prior arts, the unexamined Japanese patent application No. 52-79234/1977 discloses a system for detecting a battery voltage when a discharge current is constant, and converting the detected voltage into a corresponding battery capacity (i.e. dischargeable capacity) which is displayed in terms of a residual percentage of battery capacity.

The unexamined Japanese patent application No. 1-288784/1989 discloses a system for calculating a residual capacity (i.e. dischargeable capacity) by accumulating momently discharged amounts of a battery and correcting the accumulated value in accordance with a battery voltage or a specific gravity of battery electrolyte, thereby obtaining an accurate residual capacity.

The former system, disclosed in the unexamined Japanese patent application No. 52-79234/1977, is not satisfactory simply because it merely detects a relative percentage (to be estimated based on the detected battery voltage) which is explicitly inferior to the absolute value of the residual battery capacity directly measured or calculated. Such a system cannot be practically employed in an electric motor vehicle or the like which generally subject the battery to severe conditions, such as long-lasting and frequently repeated charging and discharge operations that could possibly cause charging polarizations in a battery, accompanied by an uncontrollable change in the relationship between the battery voltage and the battery capacity.

On the other hand, the latter system disclosed in the unexamined Japanese patent application No. 1-288784/1989 is able to quantitatively detect the residual capacity. However, performing correction of the residual capacity in accordance with the battery voltage or the specific gravity of battery electrolyte is basically troublesome since accuracy of measurement is greatly affected by various factors, such as temperature and charging/discharging conditions, thus possibly resulting in an erroneous measurement.

SUMMARY OF THE INVENTION

Accordingly, in view of above-described problems encountered in the prior art, a principal object of the present invention is to provide a battery condition detecting method capable of accurately detecting a dischargeable capacity or a degree of deterioration of the battery and surely notifying us of the necessity of recharging or exchanging the battery.

In order to accomplish this and other related objects, the present invention provides a battery charging condition detecting method comprising steps of: obtaining a map charging index representing discharge characteristics of a battery based on a battery voltage under a predetermined discharging operation, the map charging index indicating 100 at a first battery voltage obtainable immediately after the battery starts the discharging operation from a fully charged condition and also indicating 0 at a second battery voltage obtainable when the battery substantially ceases the discharging operation; calculating an accumulative charging index by subtracting a charged capacity from a temporary full-charge capacity of the battery; correcting the temporary full-charge capacity based on a difference between the map charging index and the accumulative charging index, thereby obtaining a corrected full-charge capacity; and calculating a dischargeable capacity of the battery by subtracting the discharged capacity from the corrected full-charge capacity.

In the above battery charging condition detecting method, it is preferable to further comprise steps of: obtaining a coefficient based on a ratio of a total discharge capacity of the battery during the predetermined discharging operation to a nominal capacity of the battery, the coefficient being utilized to obtain the temporary full-charge capacity used in calculating the accumulative charging index.

It is also preferable that the coefficient is corrected by an ambient temperature of the battery.

Furthermore, the above battery charging condition detecting method can comprise a step of correcting the accumulative charging index based on the dischargeable capacity.

Still further, the above battery charging condition detecting method can comprise a step of calculating a deterioration factor of the battery by dividing the corrected full-charge capacity by a nominal capacity of the battery.

Yet further, the above battery charging condition detecting method can comprise steps of: obtaining a full-charge capacity correction coefficient based on a ratio of a change of the map charging index to a change of the accumulative charging index; and multiplying the full-charge capacity correction coefficient with the temporary full-charge capacity to obtain the corrected full-charge capacity.

Moreover, the above battery charging condition detecting method can comprise a step of correcting map data corresponding to the map charging index by multiplying a residual voltage ratio representing a degree of actual change of the first battery voltage.

Furthermore, the above battery charging condition detecting method can comprise steps of: detecting plural discharge currents and corresponding battery voltages when the battery is in the discharging operation; prohibiting the detection of the discharge currents and corresponding battery voltages when the battery is subjected to a transitory charging phenomenon under the discharging operation until a momentarily charged capacity is canceled by a succeeding discharge capacity; obtaining an internal resistance of the battery by statistically processing the discharge currents and corresponding battery voltages; and estimating a battery voltage corresponding to a given discharge current based on the internal resistance.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1:
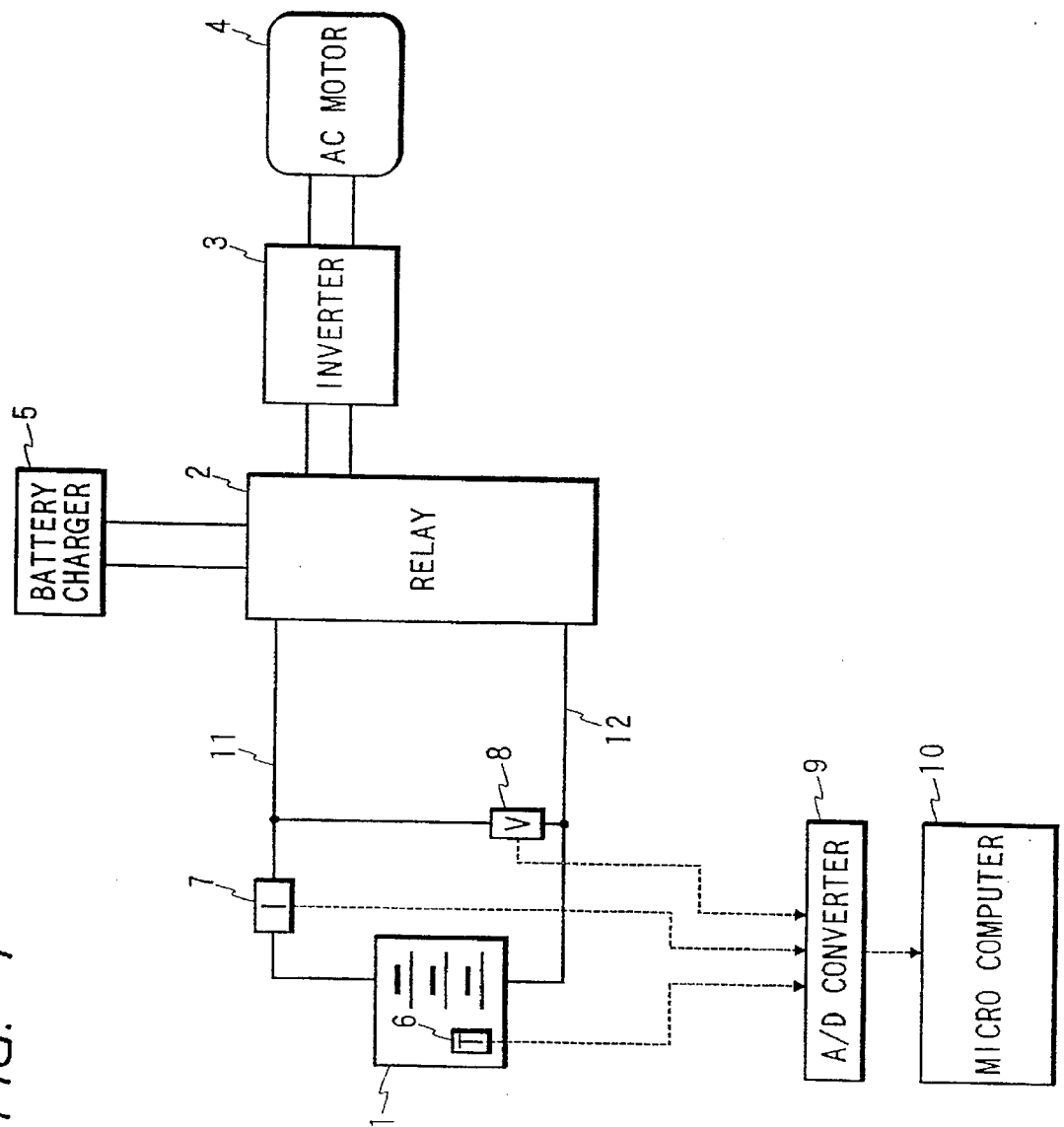
FIG. 1 is a schematic block diagram showing an electric motor vehicle driving system employing the present invention method.

Preferred embodiments of the present invention will be explained in greater detail hereinafter, with reference to the accompanying drawings. Identical parts are denoted by an identical reference numeral throughout views.

First Embodiment

FIG. 1 is a schematic block diagram showing an electric motor vehicle driving system employing the present invention method. In the drawing, a battery 1 is provided with a temperature sensor 6. The battery 1 is connected to a relay 2 via power supply wires 11 and 12. A current sensor 7 is provided in one power supply wire 11 for detecting an electric current flowing through this power supply wire 11. A voltage sensor 8 is interposed between two power supply wires 11 and 12 in parallel to the battery 1 to detect a charging voltage of the battery 1. The relay 2 has a function of selectively connecting a battery charger 5 or an inverter 3 to the battery 1 via the power supply wires 11 and 12. The inverter 3 is connected to an AC motor for actuating drive wheels of an electric motor vehicle (not shown). Output signals of the temperature sensor 6, the current sensor 7, and the voltage sensor 8 are all entered into an A/D converter 9 which converts analog signals into digital signals. The digitized signals are then supplied from the A/D converter 9 to a microcomputer 10.

The microcomputer 10 operates in accordance with various programs stored therein. Among them, a representative one is a program for detecting a charging condition of the battery 1. The procedure for detecting a charging condition of the battery 1, executed by the microcomputer 10, will be explained in detail hereinafter with reference to the flow chart of FIG. 2.

In a step 101, a current value I charged into or discharged from the battery 1 is detected by the current sensor 7; a battery voltage V is detected by the voltage sensor 8; and an ambient temperature T of the battery 1 is detected by the temperature sensor 6. Next, in a step 102, the micro computer 10 makes a judgement as to whether or not the battery 1 is fully charged. More specifically, in view of the fact that a charging current is gradually reduced in accordance with progress of a charging operation and approaches 0 when the battery is fully charged, this embodiment monitors the charging current value, and considers the battery to be fully charged when the charging current becomes virtually zero while the battery voltage is more than a predetermined value (e.g. 15 V for one battery).

If it is recognized in the step 102 that the battery 1 is in a fully charged condition, the microcomputer 10 performs a predetermined reset processing in the step 103; namely, Ah0=Ahc, Qd=0 and ΔQd=0, where Ah0 represents a present full-charge capacity temporarily used in the present cycle (or interval) of the battery charging condition detecting flow, Ahc represents a previous full-charge capacity calculated in the preceding cycle (more specifically at a step 110 which will be described later in detail), Qd represents a discharged capacity, and ΔQd represents a correction amount for the discharged capacity Qd.

In a step 104, the microcomputer 10 calculates the discharged capacity (i.e. consumed capacity) Qd of the battery 1. The discharged capacity Qd is obtained as an integrated value of the charging/discharging current I at present, as follows.

$$Qd = \int I \cdot dt = (\Sigma Id \cdot dt - \Sigma Ic \cdot \eta \cdot dt)$$

where Id is a discharge current, Ic is a charging current, and η is a charging efficiency.

Figure 3:
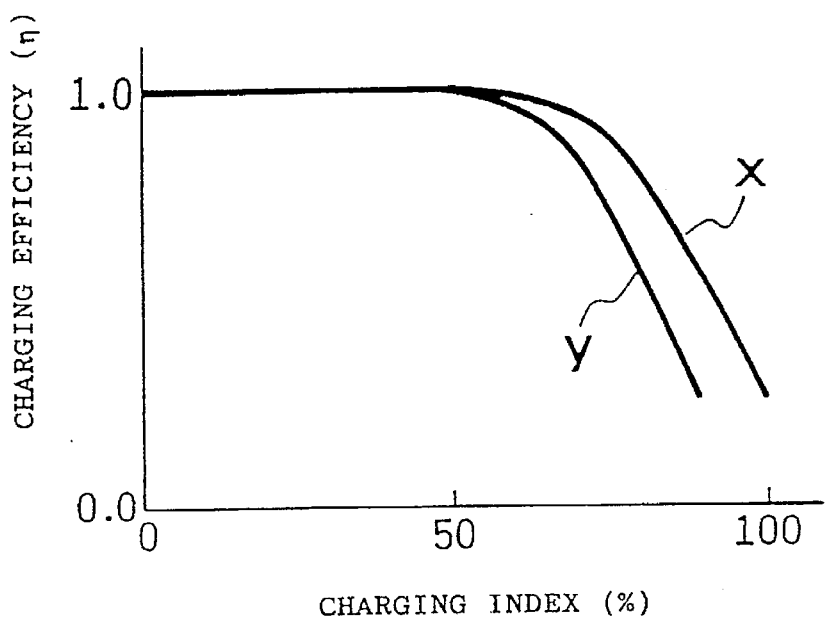
FIG. 3 is a graph showing a relation between a charging index and a charging efficiency.

As shown in FIG. 3, the charging efficiency η varies depending on a charging index later described and an ambient temperature. In the FIG. 3 graph, a curve "x" represents the charging efficiency at 30° C. while a curve "y" represents the charging efficiency at 10° C.

Next, in a step 105, the micro computer 10 calculates an accumulative charging index (accumulative SOC) according to the following equation (1).

$$\text{Accumulative SOC} = 100 \cdot (Ah0 \cdot \alpha - Qd)/(Ah0 \cdot \alpha) \ (\%) \qquad (1)$$

where α represents a capacity correction coefficient, and the necessity of multiplying such a capacity correction coefficient α with Ah0 will be explained below.

It is generally considered that an actually dischargeable capacity of a battery, when the battery is incorporated in a certain system, is not univocally determined by a nominal capacity, but is rather dependent on the current required by that system. For example, an electric motor vehicle generally requires a large current (for example 2C) in an accelerating condition, where "C" represents the nominal capacity of the battery, for example, 2C is equivalent to 300 A (=150×2) for a 150 Ah of battery.

This means that the electric motor vehicle can no longer run once the battery voltage decreases below a limit voltage (i.e. end voltage) for maintaining the required large-current discharge. Therefore, in this case, it is recognized that the actual dischargeable capacity for the electric motor vehicle is identical with the total discharge capacity discharged until the battery voltage is reduced down to the end voltage.

Figure 4:
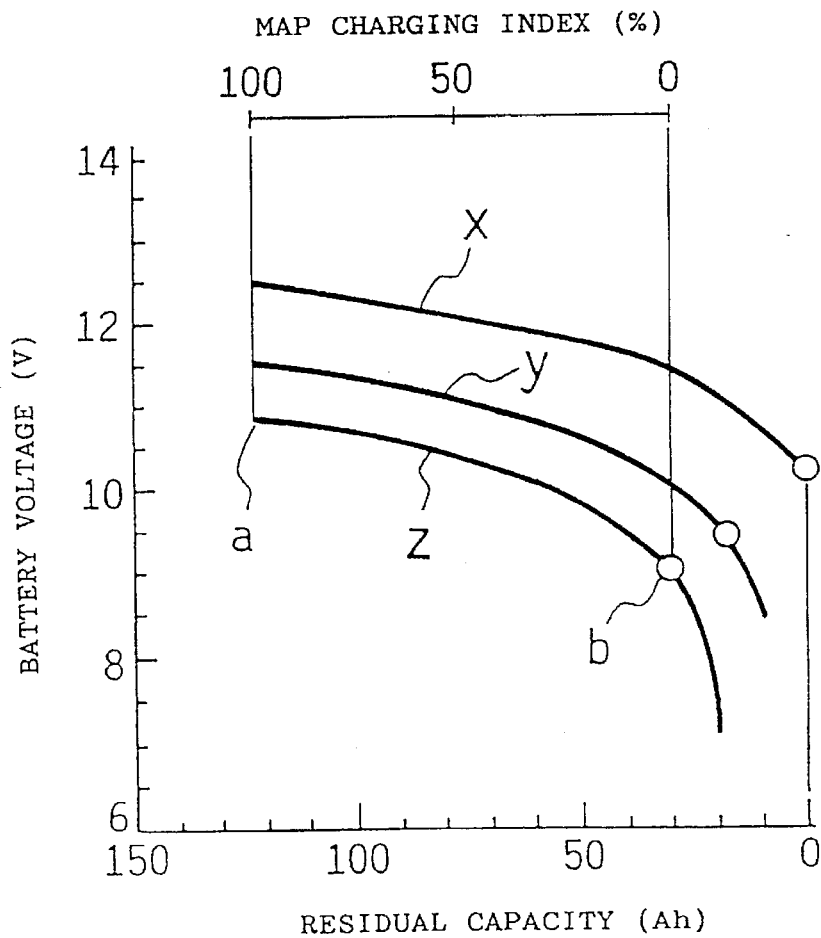
FIG. 4 is a graph showing a relation between a residual capacity and a battery voltage.

By the way, the discharge current of an electric motor vehicle is not constant, but is rather frequently varied between a large current value and a small current value. For example, the electric motor vehicle may be driven according to a designated cyclic discharge pattern, such as 6 minutes at 0.2C→5 seconds at 1C→5 seconds at 2C. FIG. 4 shows the change of the battery voltage under the above designated cyclic discharging condition. As understood from FIG. 4, the battery voltage under the 0.2C discharge current (line X) reaches the end voltage (marked by a white circle) at the residual capacity 0 with a good coincidence to the nominal capacity. However, the battery voltages under the 1C discharge current (line Y) and the 2C discharge current (line Z) reach their end voltages earlier than the residual capacity reducing to 0. Thus, the dischargeable capacity is substantially varied in response to the discharge current value, so that the dischargeable capacity is reduced with increasing discharge current.

Figure 5:
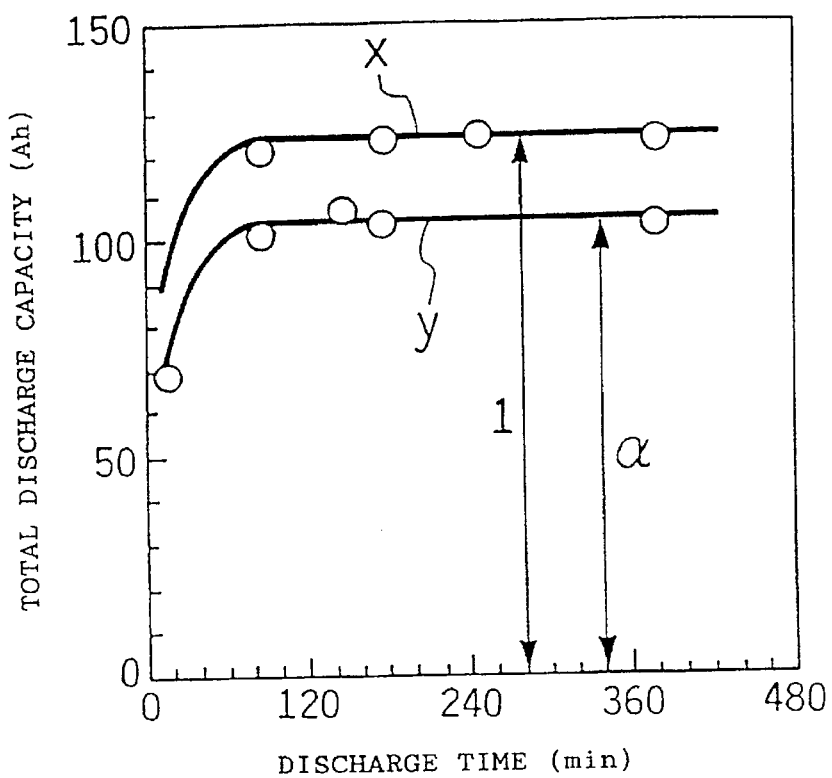
FIG. 5 is a graph showing a relation between a discharge time and a total discharge capacity.

For confirming this phenomenon, numerous tests were conducted on various combinations of discharge current and discharge time. FIG. 5 shows the result of the tests, represented by the relation between the discharge time and the total discharge capacity (i.e. dischargeable capacity). As understood from FIG. 5, the total discharge capacity under the 2C discharge current (line Y) is always smaller than the total discharge capacity under the 0.2C discharge current (line X) regardless a long or short discharge time. Namely, it is confirmed that the dischargeable capacity is reduced with increasing discharge current. Furthermore, it is understood that, once the discharge time exceeds two hours, the total discharge capacity is stabilized at a constant value.

For electric motor vehicles which are driven by frequently varying discharge currents for more than two hours, the total discharge amount under the largest (i.e. 2C) discharge current is regarded as their actual dischargeable capacity. A ratio of the found actual dischargeable capacity to the nominal capacity of the battery is used as the capacity correction coefficient a shown in the above equation (1).

Figure 6:
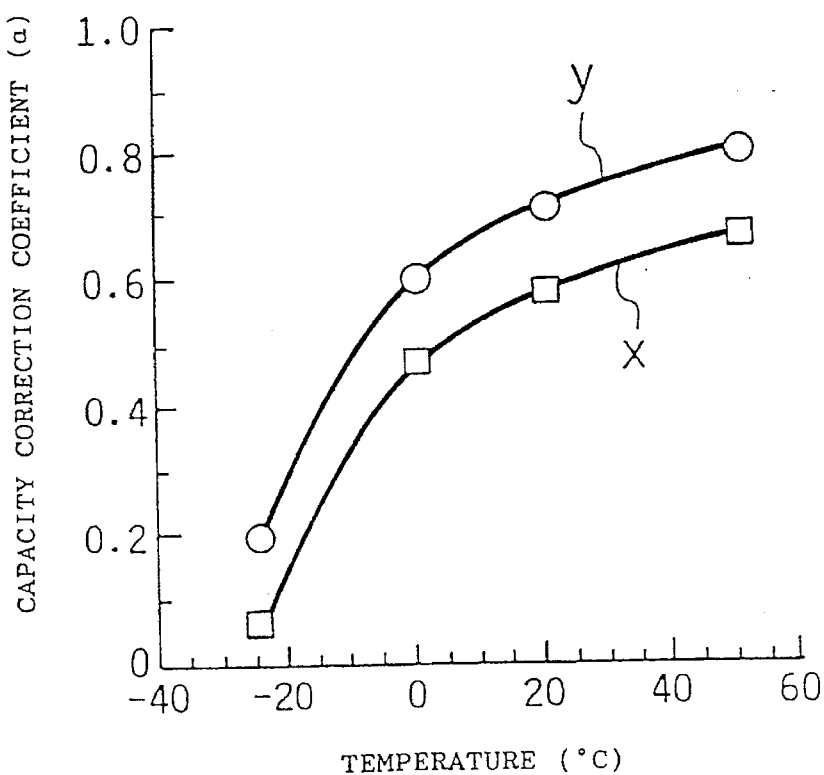
FIG. 6 is a graph showing a temperature dependency of a capacity correction coefficient.

When a battery is green or brandnew, the value of "Ah0" in the equation (1) is identical with the nominal capacity of the battery. Hence, the above accumulative SOC, if corrected by the coefficient $\alpha$, becomes 0% with a good match to the residual capacity of the battery when the battery is discharged at the 2C discharge current until its voltage decreases down to the end voltage. Thus, accumulative SOC can provide a good indication of the residual capacity of the battery, preferably used for electric motor vehicles. The capacity correction coefficient a has a temperature dependency as shown in FIG. 6; thus, in order to eliminate any effects brought by ambient temperature, it is necessary to adequately correct the coefficient $\alpha$ in accordance with the ambient temperature T obtained in the step 101. In the FIG. 6 graph, a line "x" represents the capacity correction coefficient $\alpha$ under the 2C discharge current, while a line "y" represents the capacity correction coefficient $\alpha$ under the 1C discharge current.

Next, in a step 106, the micro computer 10 detects a battery voltage Vs corresponding to a predetermined setting current (2C current in the present embodiment) and memorizes the detected voltage Vs as a referential value.

Subsequently, in a step 107, the microcomputer 10 checks if the conditions for correcting map data are established. Here, the map data will be explained in more detail.

In the 2C discharge voltage curve (line "z") of FIG. 4, a point "a" corresponding to a full-charge voltage is specified as 100% of the map charging index (map SOC), while a point "b" corresponding to an end voltage is specified as 0% of the map charging index (map SOC). An intermediate region ranging from the point "a" to the point "b" is uniformly divided and converted into the map charging index (map SOC). Then, the map SOC is obtained under each of a plurality of ambient temperatures, thereby obtaining map data.

The conditions for correcting these map data are as follows.

(1) The battery is discharged from the fully charged condition; and (2) Accumulative SOC is within a range of 100–90% (preferably 100–95%).

If the map correction conditions are satisfied, correction of the map data is executed. The necessity of performing such a correction of map data will be explained hereinafter.

Figure 7:
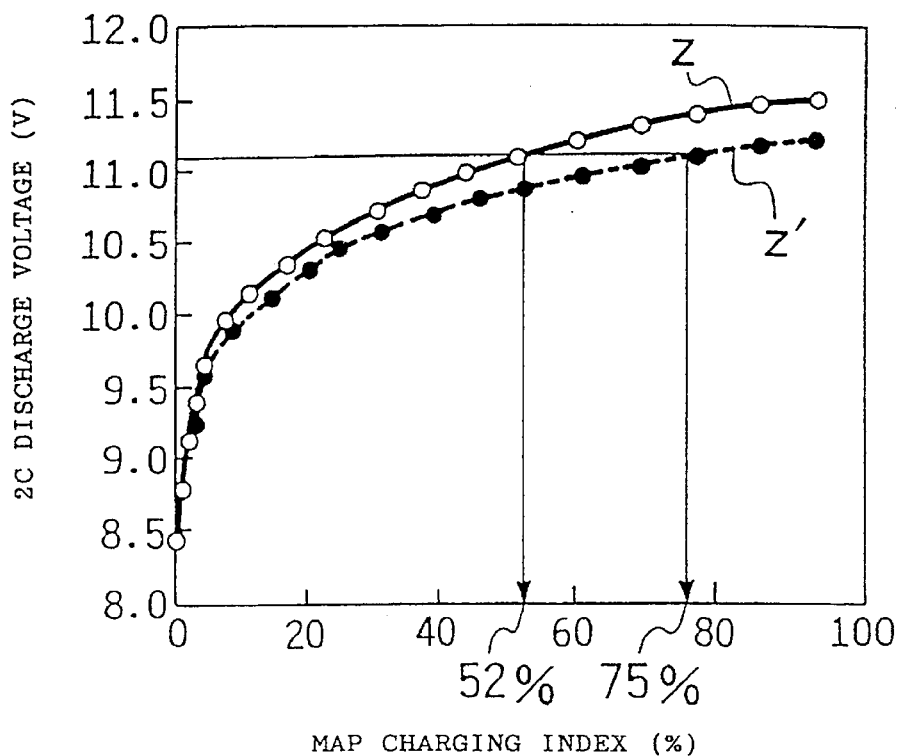
FIG. 7 is a graph showing a relation between a map charging index and a 2C discharge voltage.

FIG. 7 is a graph showing a detailed relation between the map SOC and the 2C discharge voltage at the 30° C. ambient temperature.

Figure 8:
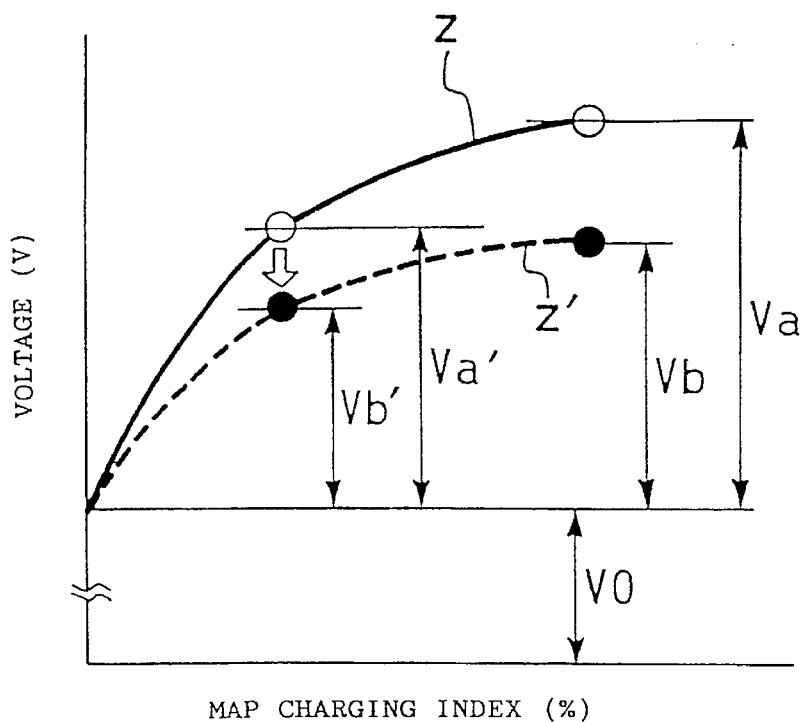
FIG. 8 is a graph showing a schematic relation between the map charging index and the battery discharge voltage.

In general, the battery voltage is influenced by dispersion of individual batteries and possibly varies due to deterioration or aging. For example, when the battery is deteriorated, the battery voltage is entirely lowered from the line Z to Z' as shown in FIG. 7. Accordingly, even if the detected battery voltage is the same, the value of the corresponding map SOC is not the same if the degree of deterioration of the battery is different. For example, the stored-map data (line "z"), which is stored as the characteristics of a brandnew battery, will indicate 52% of map SOC for the 11.1 battery voltage, while the map data (line "z'") which is stored as the characteristics of a deteriorated battery will indicate 75% of map SOC for the same battery voltage. Hence, an appropriate correction of map data is definitely required for assuring accuracy in the measurements. Details of the correction will be explained with reference to FIG. 8.

In the drawing, "Va" and "Vb" represent residual voltages of a brandnew battery and a used battery, respectively, detectable immediately after the discharge operation is started from the fully charged condition. These residual voltages "Va" and "Vb" represent values relative to the end voltage Vo. A ratio Vb/Va ($=\phi$) is utilized to correct the map data. Namely, each battery voltage Va' on the line "z" is converted into Vb' (Vb'=Va'·$\phi$). Through this correction, accuracy of the map SOC is always assured no matter how much the battery is deteriorated or aged.

Figure 2:
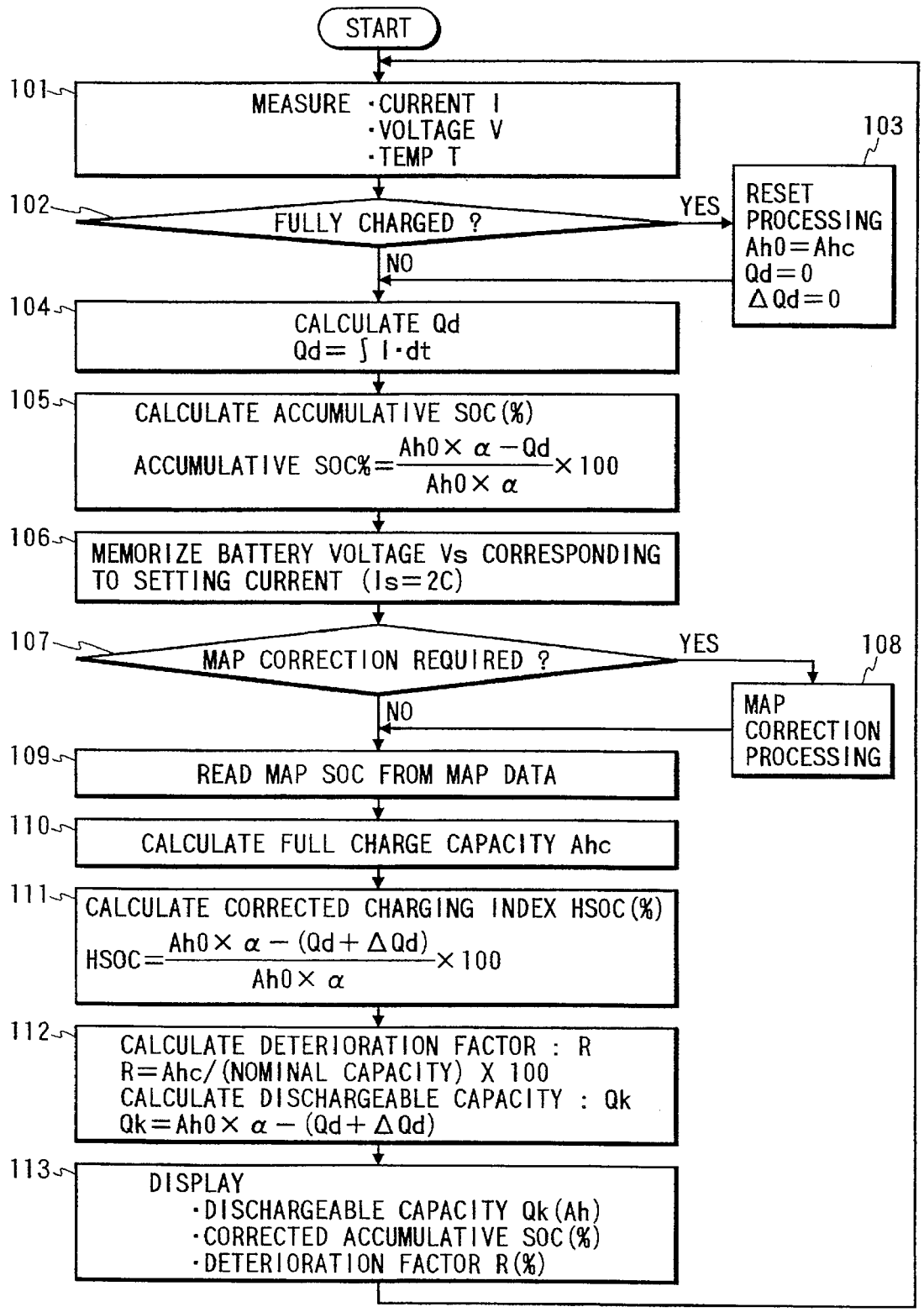
FIG. 2 is a flow chart illustrating a procedure for detecting a charging condition in accordance with a first embodiment of the present invention.

In a step 109 of FIG. 2, the microcomputer 10 obtains a map SOC corresponding to the battery voltage Vs memorized in the step 108 with reference to the map.

Subsequently, in a step 110, the micro computer 10 calculates a full-charge capacity Ahc which is later used for the reset processing in the step 103 of the next flow. Details of calculating the full-charge capacity Ahc will be explained below.

Figure 9:
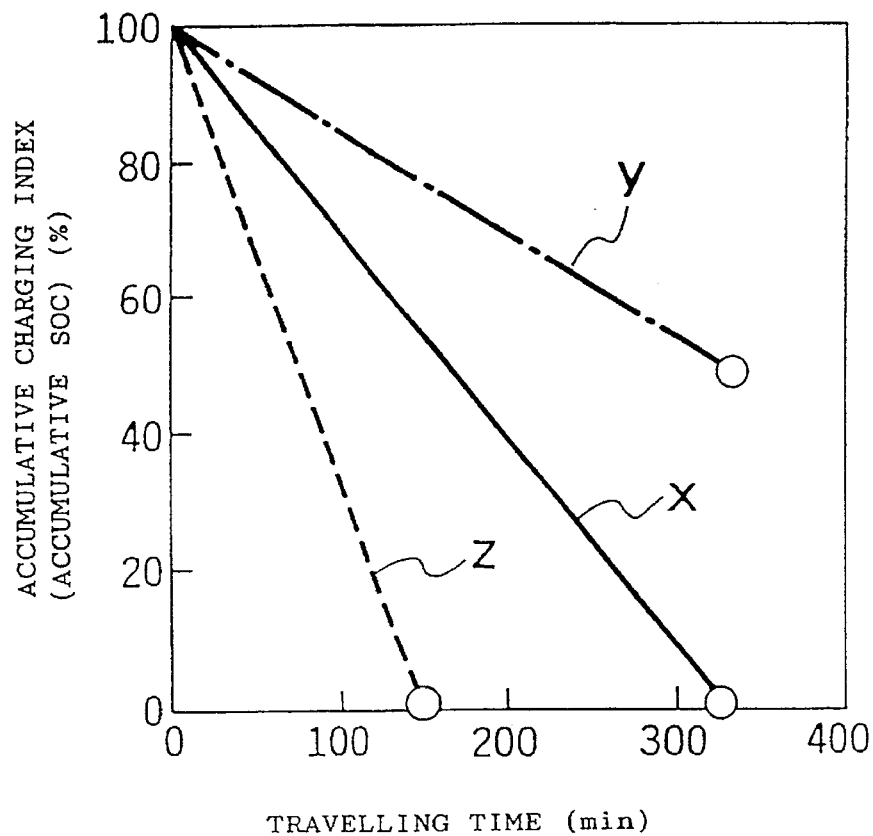
FIG. 9 is a graph showing a relation between a travelling time and an accumulative charging index.

Evaluation of the accumulative SOC, expressed by the above equation (1), is performed on the charging/discharging tests equivalent to 10 modes, the result of which is shown in FIG. 9. As shown by a line "x" of the FIG. 9 graph, a total of 325 minutes of continuous discharging operation is feasible when the full-charge capacity Ah0 is accurately given, while the accumulative SOC reduces from 100% to 0%. On the contrary, if a given full-charge capacity Ah0 is twice as large as an actual value (line "y"), the accumulative SOC will still indicate 50% despite of passage of 325 minutes comparable to the substantial termination of discharging operation, thus producing a large error. Meanwhile, if the given full-charge capacity Ah0 is half as large as the actual value (line "z"), the accumulative SOC will quickly reach 0% as early as 160 minutes although the battery still has an enough capacity for continuous discharge. In view of the above, it is definitely necessary to give an accurate full-charge capacity Ah0 to obtain an accurate accumulative SOC.

Figure 10:
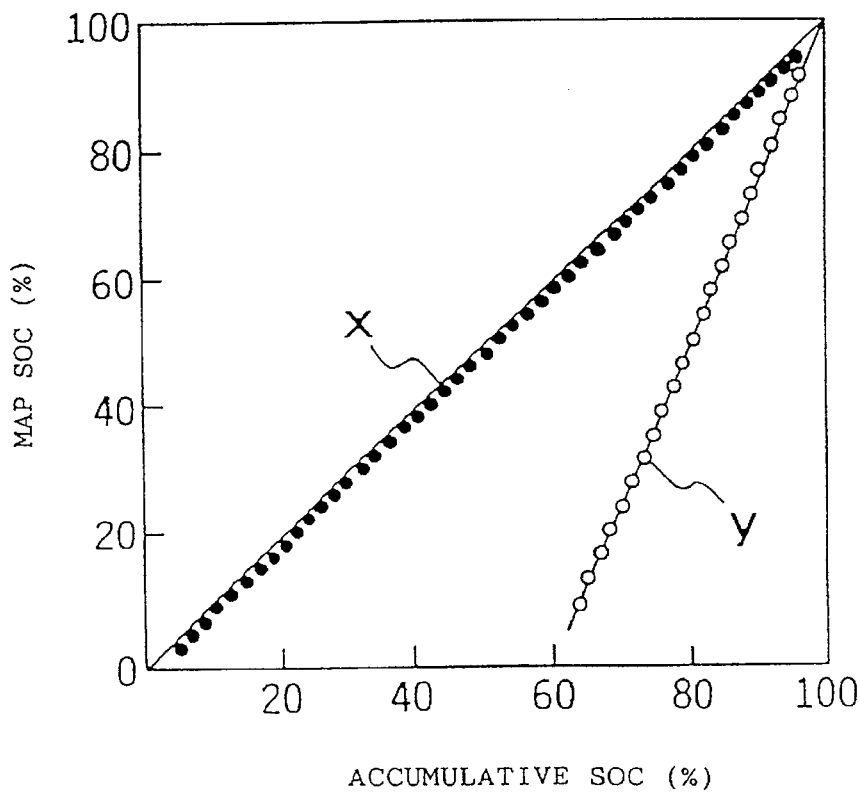
FIG. 10 is a graph showing a relation between the accumulative charging index and the map charging index.

FIG. 10 shows a graph showing a correlation between the map SOC and the accumulative SOC. A line "x" shows a correlation between the map SOC and the accumulative SOC recognized when a brandnew battery is discharged from a fully charged condition. From this result, it is found that both the map SOC and the accumulative SOC simultaneously reduce from 100% to 0% with good coincidence. In other words, a ratio of changes in this case is 1.0.

On the other hand, when the full-charge capacity Ah0 is smaller than the nominal capacity by an amount of 40%, the accumulative SOC varies from 100% to 60% while the map SOC varies from 100% to 0%, as shown by a line "y" of FIG. 10. Thus, the ratio of changes is:

(Change of Accumulative SOC/Change of Map SOC)=40/100=0.4

It means that a consumed (charged) amount is only 40% of the full-charge capacity Ah0 temporarily given as an initial value of the accumulative SOC.

In this manner, calculating a ratio of changes between the map SOC and the accumulative SOC lets us know how much the full-charge capacity Ah0 temporarily given as an initial value of the accumulative SOC is deviated from a true value.

Figure 11:
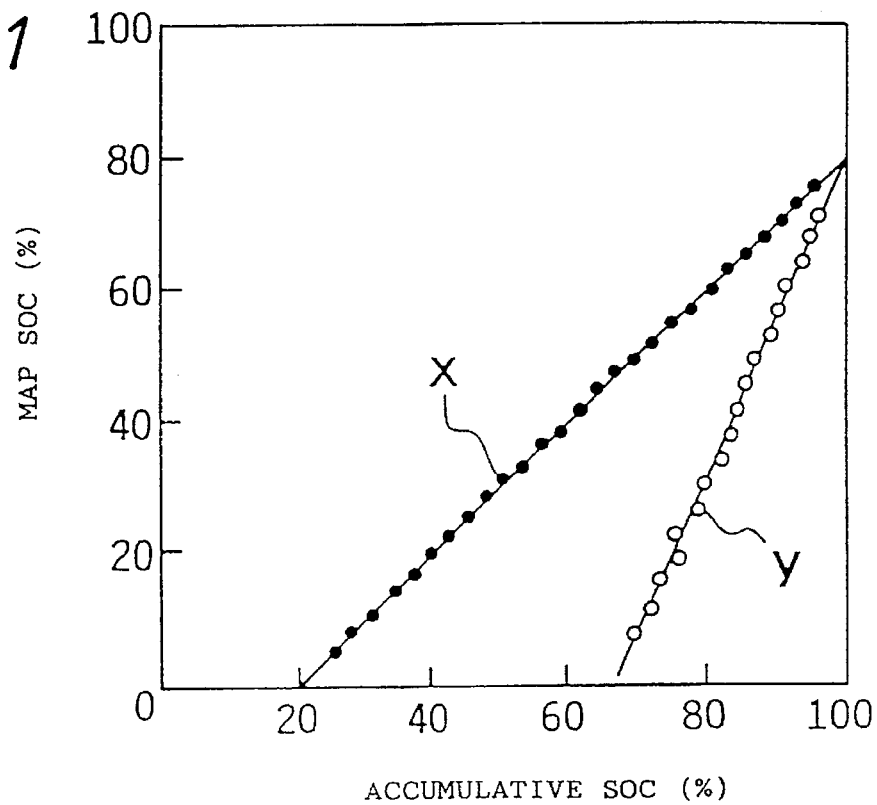
FIG. 11 is a graph showing a relation between the accumulative charging index and the map charging index.

A similar relation is established when the discharge is not started from the fully charged condition, i.e. when the correction of the map data is not executed in step 108, as shown in FIG. 11. In the drawing, a line "x" shows a correlation between the map SOC and the accumulative SOC of a brandnew battery, according to which the accumulative SOC varies from 100% to 20% while the map SOC varies from 80% to 0%, with the ratio of changes being 1.0. A line "y" shows a corresponding correlation of a used battery, according to which the accumulative SOC varies from 100% to 68% while the map SOC varies from 80% to 0%, with the ratio of changes being 0.4.

Accordingly, a true value of the full-charge capacity Ahc is obtained from the following equation.

$$Ahc = Ah0 \cdot (\text{Change of Accumulative } SOC/\text{Change of Map } SOC)$$
$$= Ah0 \cdot \gamma$$

where $\gamma$ is a correction coefficient for the full-charge capacity Ah0.

This is because the change of map SOC shows the ratio of the discharged capacity to the true full-charge capacity, while the accumulative SOC shows a ratio of the discharged capacity to the full-charge capacity temporarily stored as an initial value.

As apparent from FIG. 10, when the battery is discharged from a fully charged condition, the true full-charge capacity Ahc is obtained by the following equation.

$$Ahc=Ah0 \cdot \{100-(\text{Accumulative } SOC)_0\}/100$$

where (Accumulative SOC)$_0$ represents an accumulative SOC when the map SOC is 0.

In a step 110 of FIG. 2, the full-charge capacity is calculated by any one of the above calculation methods. The resultant full-charge capacity Ahc is reserved for use in the reset processing (step 103) of the next flow.

According to the present embodiment, when the battery is discharged from a fully charged condition, an accumulative SOC corresponding to 0 of the map SOC is estimated for obtaining the true full-charge capacity Ahc by the following equation.

$$Ahc=Ah0 \cdot (100-(\text{Accumulative } SOC)_{es})/100$$

where (Accumulative SOC)$_{es}$ represents an accumulative SOC corresponding to 0 of the map SOC.

However, there is a possibility of an error because an actual charging amount of the battery in the next full charging operation may not be accurately equalized to the calculated full-charge capacity Ah0. To eliminate this kind of error, it is necessary is to correct the full-charge capacity Ah0 calculated in the previous discharging operation during the present discharging operation. To this end, the correction capacity ΔQd (i.e. the correction amount for the discharged capacity Qd) is determined to equalize the accumulative SOC calculated in the step 105 with the map SOC read from the map data. More specifically, in a step 111, the microcomputer 10 obtains HSOC as a corrected accumulative SOC, defined by the following equation (2).

$$HSOC=100 \cdot \{Ah0 \cdot \alpha - (Qd+\Delta Qd)\}/(Ah0 \cdot \alpha) \, (\%) \quad (2)$$

Figure 12:
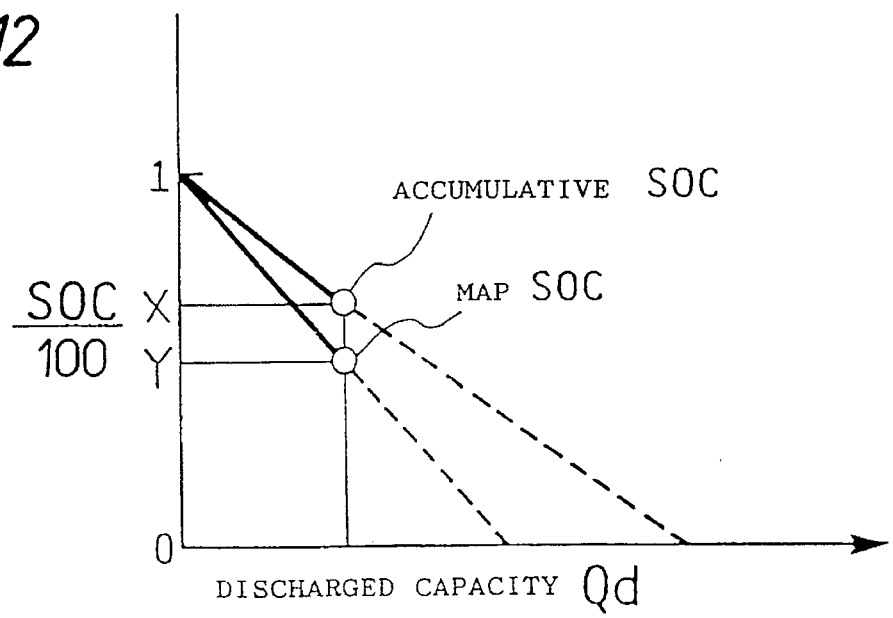
FIG. 12 is a graph showing changes of the accumulative charging index and the map charging index proportional to an increase of discharging capacity.

Here, ΔQd is a factor for correlating the changes of the accumulative SOC and the map SOC indicated by the line "y" in FIG. 10 with the discharged capacity Qd from the full charging condition. More specifically, as shown in FIG. 12, the accumulative SOC and the map SOC indicate "X" and "Y" respectively for a given discharged capacity Qd. If the value Qd is increased, the discharging operation will continue up to the value equivalent to Ahc·α. In this case, if the full-charge capacity Ah0 is erroneously input as an initial value, the accumulative SOC will not indicate 0 even if the discharge capacity Qd is increased and equalized to Ahc·α.

Accordingly, the value ΔQd needs to be determined so as to equalize the accumulative SOC and the map SOC, using the following equations.

$$\Delta Qd=(Ah0-Ahc) \cdot \alpha \quad (3)$$

$$Qd:(1-Y)=(Ahc \cdot \alpha):1 \quad (4)$$

$$Qd:(1-X)=(Ah0 \cdot \alpha):1 \quad (5)$$

By eliminating Ah0 and Ahc from the above equations (3), (4) and (5), the value ΔQd is obtained as follows.

$$\Delta Qd=(X-Y) \, Qd/(1-X) \, (1-Y)$$

As another method of obtaining ΔQd, it will be possible to always compare the accumulative SOC with the map SOC, so as to equalize them by gradually increasing or decreasing the correction ΔQd.

Subsequently, in a step 112, the microcomputer 10 calculates a dischargeable capacity Qk based on the HSOC (%) corrected in the step 111, using the following equation (6).

$$Qk=(Aho \cdot \alpha)-(Qd+\Delta Qd) \quad (6)$$

The micro computer 10 also calculates a deterioration factor "R", which is given by an equation R=100·Ahc/(Nominal capacity).

Then, in a step 113, the microcomputer 10 displays data of the dischargeable capacity "Qk", the corrected accumulative HSOC, and the deterioration factor "R", although the corrected accumulative HSOC can be replaced by the map SOC.

The dischargeable capacity "Qk" represents a continuously dischargeable capacity under the current and temperature used for calculating the capacity correction coefficient α.

Second Embodiment

Although the first embodiment detects the battery voltage at the step 106, usually the battery voltage includes noise. This is especially true for batteries used for electric motor vehicles. Charging polarization occurs in such batteries due to regenerative charging during deceleration. Thus, it is difficult to obtain an accurate battery voltage by a momentary measurement.

Figure 13:
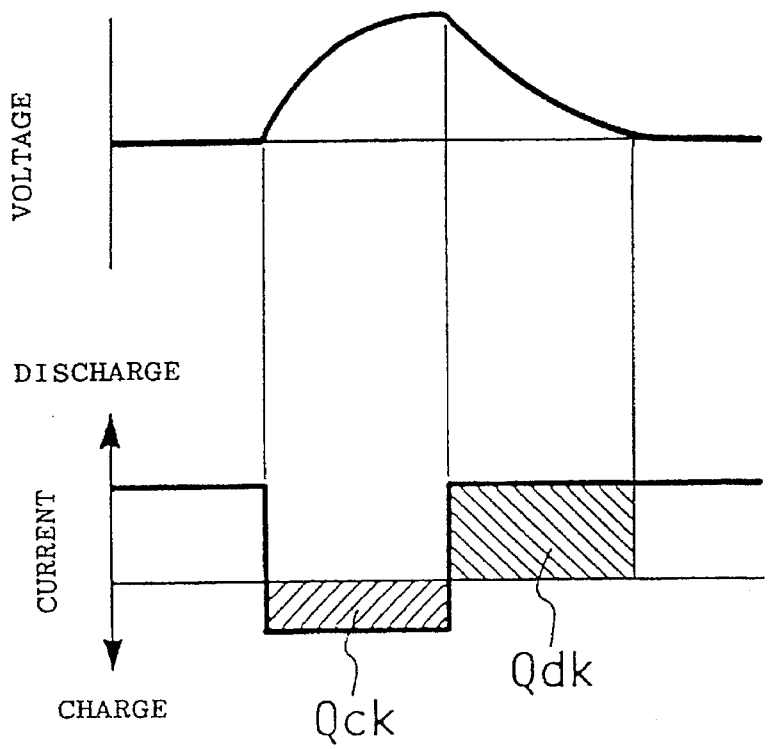
FIG. 13 is a graph showing a time variation of battery voltage and current.
Figure 14:
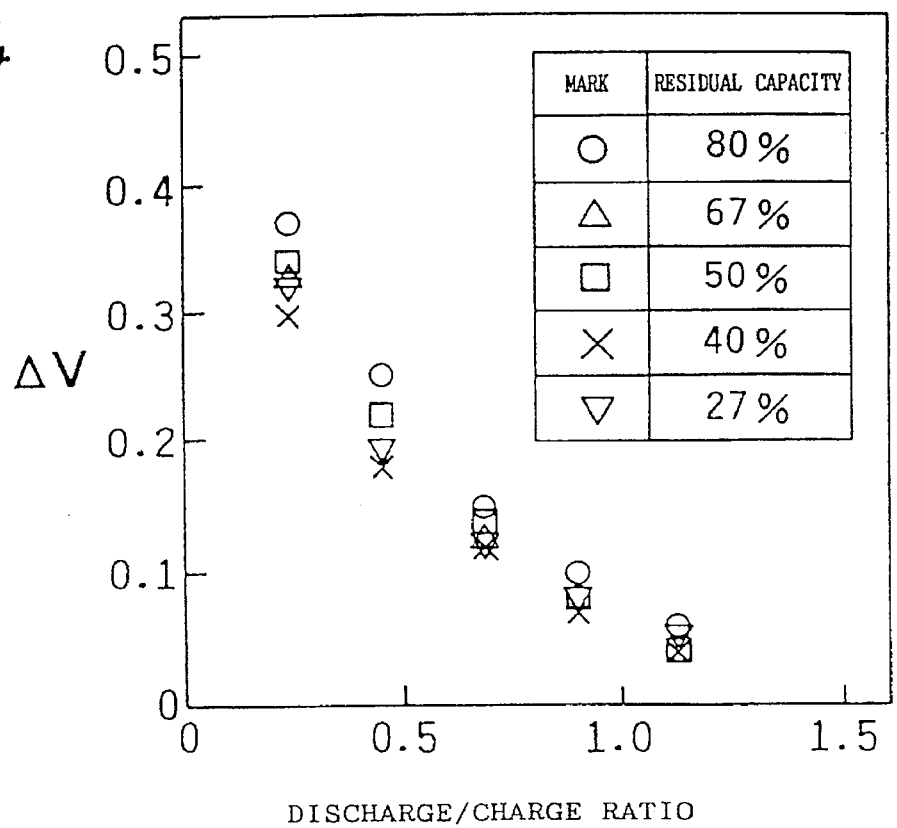
FIG. 14 is a graph showing a relation between a discharge/charging ratio and an increase of battery voltage.

The effect to charging polarization will be explained with reference to FIG. 13. In the case of Pb batteries, the battery voltage is increased by transitory charging because concentrated sulfuric acid is temporarily accumulated around the electrode. The increase of the battery voltage continues until a succeeding discharge capacity Qdk cancels the charged capacity Qck. This will be explained with reference to a graph of FIG. 14. A voltage increase ΔV seems to appear due to charging polarization when a discharge amount is insufficient relative to a corresponding charge regardless of the amount of residual capacity. The voltage increase ΔV decreases with the increasing discharge amount, and is finally reduced to 0 after the discharging amount exceeds the charging amount.

Figure 15:
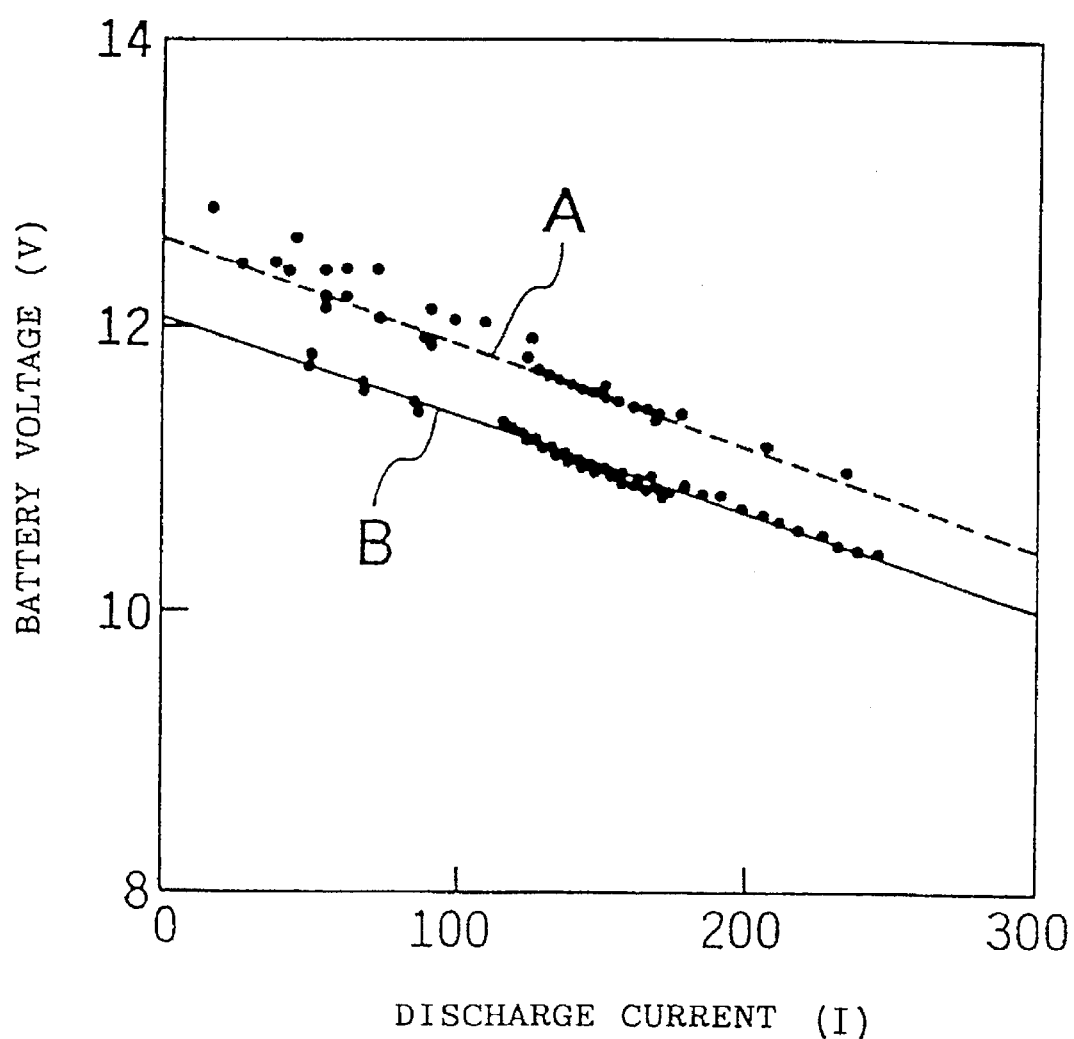
FIG. 15 is a graph showing a relation between the discharge current and the battery voltage.

FIG. 15 shows the relation between the battery voltage (V) and the discharge current (I), plotted on a V-I plane based on the data detected within a certain period of time. From the FIG. 15 graph, it is found that many of detected data are deviated from a V-I characteristic line "A" when the detected data are subjected to charging polarization. Meanwhile, many of detected data are aligned on a V-I characteristic line "B" when the data affected by the charging polarization are removed. Thus, it becomes possible to obtain an accurate V-I characteristic line (where the inclination of the obtained line is equivalent to an internal resistance of a battery) by removing noise using an appropriate statistical processing such as a least square method.

Figure 16:
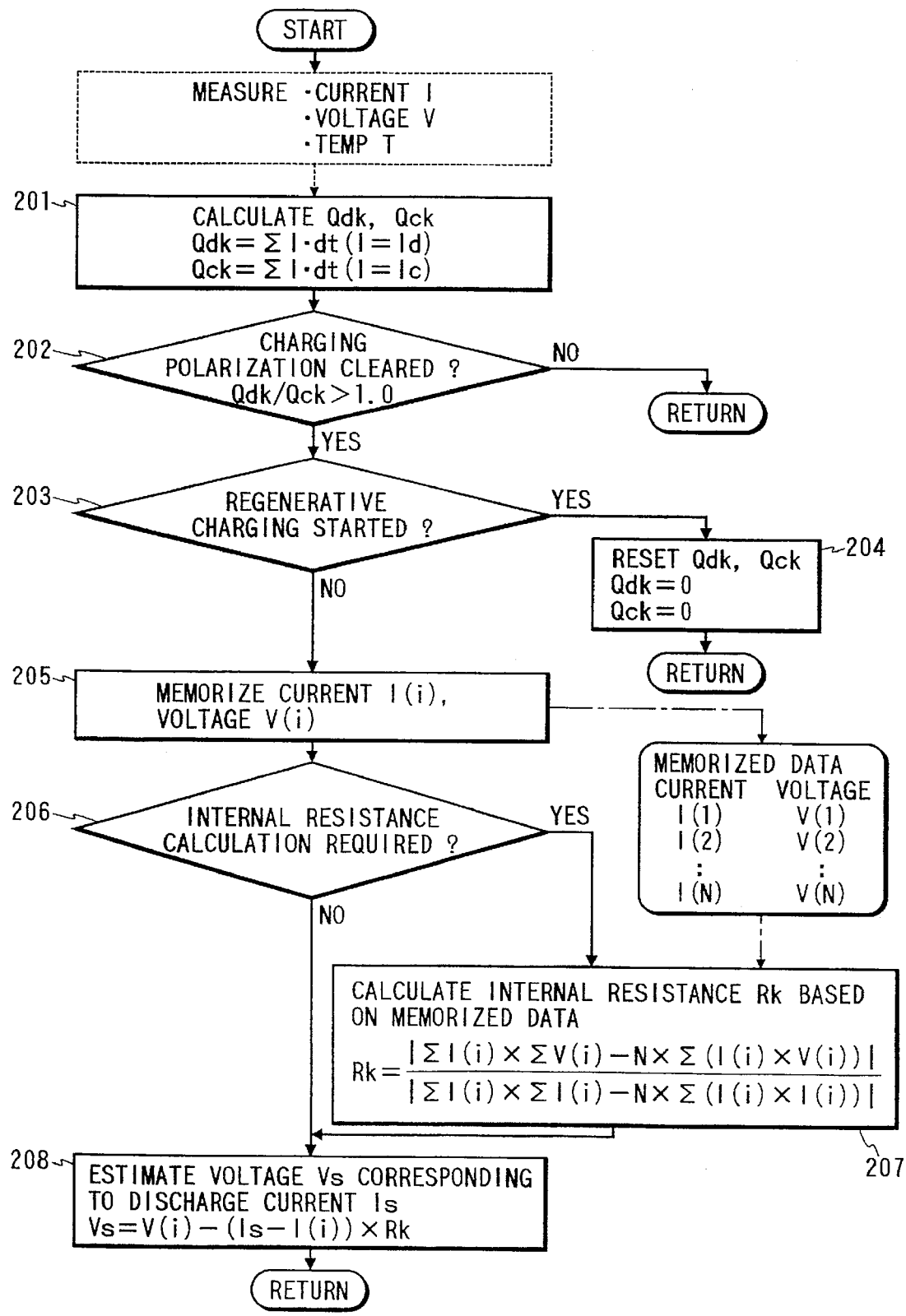
FIG. 16 is a flow chart showing a procedure for estimating a charging voltage in accordance with a second embodiment of the present invention.

In view of above, the second embodiment introduces a procedure for estimating a battery voltage corresponding to a predetermined discharge current, which will be explained below in detail with reference to the flow chart of FIG. 16.

In a step 201, the microcomputer 10 calculates the discharge capacity Qdk and the charge capacity Qck by integrating momentary discharge and charge currents, respectively. In the next step 202, the microcomputer 10 checks whether or not a ratio Qdk/Qck is more than 1.0 to confirm the elimination of charging polarization. If a "YES" answer is not obtained in the step 202, the microcomputer 10 returns the start point of the flow without executing the succeeding steps. When a "YES" answer is obtained in the step 202, the microcomputer 10 checks in a step 203 whether or not a regenerative charging is started. When the regenerative charging is started, the discharge capacity Qdk and the charge capacity Qck are reset to 0 in a step 204.

On the other hand, if no regenerative charging is recognized, the microcomputer 10 memorizes the current I(i) and the voltage V(i) at this moment in a step 205. A memory (such as a RAM) stores a total of N combinations of data, each consisting of a pair of current data and voltage data, including the presently stored current I(i) and the voltage V(i).

Next, in a step 206, the microcomputer 10 checks whether or not the conditions for calculating an internal resistance are established. The conditions in this case are as follows:

Increase of the discharged capacity Qd since the previous internal resistance calculation is more than 2% (or somewhere in a range of 0.1–10%) of the nominal capacity; and The amount of data stored is sufficient (for example 10–600 data items, when each data item is obtained successively every second).

When the above conditions are satisfied, the microcomputer 10 calculates an internal resistance Rk by the least square method in a step 207.

Subsequently, the microcomputer 10 calculates an estimated voltage Vs corresponding to a given discharge current Is according to the following equation representing the V-I characteristics, using the internal resistance Rk obtained in the step 207.

$$Vs=V(i)-(Is-I(i))\cdot Rk$$

In this embodiment, the value "Is" is given by Is=2.0 C.

That is, calculating an IR loss based on V and I data obtainable from a running electric motor vehicle makes it possible to estimate a battery voltage at a given discharge current. Thus, it becomes possible to eliminate any effects of noise by averaging the estimated voltages detected during several to several tens of seconds.

Hence, it becomes feasible to estimate an optimized battery voltage, which is far more accurate when compared with a battery voltage momentarily obtained under the influence of charging polarization and noise. Hence, calculation and display of the dischargeable capacity Qk, the accumulative HSOC, and the deterioration factor R can be accurately performed.

Third Embodiment

Although the above embodiments are explained based on the residual capacity expressed by Ah (quantity of electricity), it will be acceptable to replace the portions calculated based on the units of Ah (quantity of electricity) by the values calculated based on the units of Wh (quantity of energy).

Thus, the third embodiment is different from the first embodiment in using different units. Hereinafter, only the portions to be changed to the units of Wh (quantity of energy) will be explained.

At the step 103 of FIG. 2, "Ah0" and "Ahc" are expressed by the units of Wh;

at the step 104 of FIG. 2, the equation for obtaining the discharge capacity Qd is changed to:

$$Qd=\int I\cdot V\cdot dt;$$

at the step 105 of FIG. 2, "Ah0" is expressed by the units of Wh;

at the step 106 of FIG. 2, the predetermined setting current (2C) is changed to a predetermined output (2,200 W in this embodiment);

at the step 109 of FIG. 2, the map data (FIG. 7) is changed to a discharge voltage corresponding to the 2,200 W discharge;

at the step 110 of FIG. 2, the full-charge capacity "Ahc" is expressed by the units of Wh;

at the step 111 of FIG. 2, "ΔQd" is expressed by the units of Wh;

at the step 112 of FIG. 2, "Qk" is expressed by the units of Wh; and at the step 113 of FIG. 2, the dischargeable capacity "Qk" is expressed by the units of Wh.

In short, all the map data are changed in accordance with change from the predetermined discharge current to the predetermined discharge output. And, all the values calculated by the units of "Ah" are changed to the values expressed by the units of "Wh". The charging efficiency η and the capacity correction coefficient α of FIGS. 3 and 6 need to be obtained based on the data expressed by the units of Wh.

As explained in the foregoing description, the battery charging condition detecting method of the present invention makes it possible to accurately obtain the residual capacity of the battery, the accumulative charging index and the deterioration factor or the like without being effected by deterioration of the battery or the like, even if the battery is subjected to frequently repeated charging and discharge operations. Thus, the battery charging condition detecting method of the present invention can be preferably applied to driving batteries for electric motor vehicles.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A battery charging condition detecting method comprising steps of:

obtaining a map charging index representing discharge characteristics of a battery based on a battery voltage under a predetermined discharging operation, said map charging index indicating 100 at a first battery voltage obtainable immediately after said battery starts said predetermined discharging operation from a fully charged condition and also indicating 0 at a second battery voltage obtainable when said battery substantially ceases said predetermined discharging operation;

calculating an accumulative charging index by subtracting a charged capacity from a temporary full-charge capacity of said battery;

correcting said temporary full-charge capacity based on a difference between said map charging index and said accumulative charging index, thereby obtaining a corrected full-charge capacity; and calculating a dischargeable capacity of said battery by subtracting a discharged capacity from said corrected full-charge capacity.

2. The battery charging condition detecting method defined by claim 1, further comprises steps of:

obtaining a coefficient based on a ratio of a total discharge capacity of said battery during said predetermined discharging operation to a nominal capacity of said battery, said coefficient being utilized to obtain said temporary full-charge capacity used in calculating said accumulative charging index.

3. The battery charging condition detecting method defined by claim 2, wherein said coefficient is corrected by an ambient temperature of the battery.

4. The battery charging condition detecting method defined by claim 1, further comprises a step of correcting said accumulative charging index based on said dischargeable capacity.

5. The battery charging condition detecting method defined by claim 1, further comprises a step of calculating a deterioration factor of the battery by dividing said corrected full-charge capacity by a nominal capacity of the battery.

6. The battery charging condition detecting method defined by claim 1, further comprises steps of:

obtaining a full-charge capacity correction coefficient based on a ratio of a change of said map charging index to a change of said accumulative charging index; and multiplying said full-charge capacity correction coefficient with said temporary full-charge capacity to obtain said corrected full-charge capacity.

7. The battery charging condition detecting method defined by claim 1, further comprises a step of correcting map data corresponding to said map charging index by multiplying a residual voltage ratio, said residual voltage ratio representing a degree of actual change of said first battery voltage.

8. The battery charging condition detecting method defined by claim 1, further comprises steps of:

detecting a plurality of discharge currents and corresponding battery voltages when said battery is in said predetermined discharging operation;

prohibiting said step of detecting said plurality of discharge currents and said corresponding battery voltages when said battery is subjected to a transitory charging phenomenon under said predetermined discharging operation until a momentarily charged capacity is canceled by a succeeding discharge capacity;

obtaining an internal resistance of said battery by statistically processing said plurality of discharge currents and said corresponding battery voltages detected; and estimating a battery voltage corresponding to a given discharge current based on said internal resistance.

9. The battery charging condition detecting method defined by claim 2, further comprises a step of correcting said accumulative charging index based on said dischargeable capacity.

10. The battery charging condition detecting method defined by claim 2, further comprises a step of calculating a deterioration factor of said battery by dividing said corrected full-charge capacity by said nominal capacity of the battery.

11. The battery charging condition detecting method defined by claim 2, further comprises steps of:

obtaining a full-charge capacity correction coefficient based on a ratio of a change of said map charging index to a change of said accumulative charging index; and multiplying said full-charge capacity correction coefficient with said temporary full-charge capacity to obtain said corrected full-charge capacity.

12. The battery charging condition detecting method defined by claim 2, further comprises a step of correcting map data corresponding to said map charging index by multiplying a residual voltage ratio, said residual voltage ratio representing a degree of actual change of said first battery voltage.

13. The battery charging condition detecting method defined by claim 2, further comprises steps of:

detecting a plurality of discharge currents and corresponding battery voltages when said battery is in said predetermined discharging operation;

prohibiting said step of detecting said plurality of discharge currents and said corresponding battery voltages when said battery is subjected to a transitory charging phenomenon under said predetermined discharging operation until a momentarily charged capacity is canceled by a succeeding discharge capacity;

obtaining an internal resistance of said battery by statistically processing said plurality of discharge currents and said corresponding battery voltages detected; and estimating a battery voltage corresponding to a given discharge current based on said internal resistance.

14. The battery charging condition detecting method defined by claim 3, further comprises a step of correcting said accumulative charging index based on said dischargeable capacity.

15. The battery charging condition detecting method defined by claim 3, further comprises steps of:

obtaining a full-charge capacity correction coefficient based on a ratio of a change of said map charging index to a change of said accumulative charging index; and multiplying said full-charge capacity correction coefficient with said temporary full-charge capacity to obtain said corrected full-charge capacity.

16. The battery charging condition detecting method defined by claim 3, further comprises a step of correcting map data corresponding to said map charging index by multiplying a residual voltage ratio, said residual voltage ratio representing a degree of actual change of said first battery voltage.

17. The battery charging condition detecting method defined by claim 3, further comprises steps of:
   detecting a plurality of discharge currents and corresponding battery voltages when said battery is in said predetermined discharging operation;
   prohibiting said step of detecting said plurality of discharge currents and said corresponding battery voltages when said battery is subjected to a transitory charging phenomenon under said predetermined discharging operation until a momentarily charged capacity is canceled by a succeeding discharge capacity;
   obtaining an internal resistance of said battery by statistically processing said plurality of discharge currents and said corresponding battery voltages detected; and
   estimating a battery voltage corresponding to a given discharge current based on said internal resistance.

18. The battery charging condition detecting method defined by claim 4, further comprises steps of:
   obtaining a full-charge capacity correction coefficient based on a ratio of a change of said map charging index to a change of said accumulative charging index; and
   multiplying said full-charge capacity correction coefficient with said temporary full-charge capacity to obtain said corrected full-charge capacity.

19. The battery charging condition detecting method defined by claim 4, further comprises a step of correcting map data corresponding to said map charging index by multiplying a residual voltage ratio, said residual voltage ratio representing a degree of actual change of said first battery voltage.

20. The battery charging condition detecting method defined by claim 4, further comprises steps of:
   detecting a plurality of discharge currents and corresponding battery voltages when said battery is in said predetermined discharging operation;
   prohibiting said step of detecting said plurality of discharge currents and said corresponding battery voltages when said battery is subjected to a transitory charging phenomenon under said predetermined discharging operation until a momentarily charged capacity is canceled by a succeeding discharge capacity;
   obtaining an internal resistance of said battery by statistically processing said plurality of discharge currents and said corresponding battery voltages detected; and
   estimating a battery voltage corresponding to a given discharge current based on said internal resistance.

21. The battery charging condition detecting method defined by claim 5, further comprises a step of correcting map data corresponding to said map charging index by multiplying a residual voltage ratio, said residual voltage ratio representing a degree of actual change of said first battery voltage.

22. The battery charging condition detecting method defined by claim 5, further comprises steps of:
   detecting a plurality of discharge currents and corresponding battery voltages when said battery is in said predetermined discharging operation;
   prohibiting said step of detecting said plurality of discharge currents and said corresponding battery voltages when said battery is subjected to a transitory charging phenomenon under said predetermined discharging operation until a momentarily charged capacity is canceled by a succeeding discharge capacity;
   obtaining an internal resistance of said battery by statistically processing said plurality of discharge currents and said corresponding battery voltages detected; and
   estimating a battery voltage corresponding to a given discharge current based on said internal resistance.

23. The battery charging condition detecting method defined by claim 3, further comprises a step of calculating a deterioration factor of said battery by dividing said corrected full-charge capacity by said nominal capacity of said battery.

24. The battery charging condition detecting method defined by claim 4, further comprises a step of calculating a deterioration factor of said battery by dividing said corrected full-charge capacity by a nominal capacity of said battery.

25. The battery charging condition detecting method defined by claim 5, further comprises steps of:
   obtaining a full-charge capacity correction coefficient based on a ratio of a change of said map charging index to a change of said accumulative charging index; and
   multiplying said full-charge capacity correction coefficient with said temporary full-charge capacity to obtain said corrected full-charge capacity.

26. The battery charging condition detecting method defined by claim 6, further comprises a step of correcting map data corresponding to said map charging index by multiplying a residual voltage ratio, said residual voltage ratio representing a degree of actual change of said first battery voltage.

* * * * *

UNITED STATES PATENT AND TRADEMARK OFFICE
CERTIFICATE OF CORRECTION

PATENT NO. : 5,650,712
DATED : July 22, 1997
INVENTOR(S) : Kawai, et. al.

It is certified that error appears in the above-indentified patent and that said Letters Patent is hereby corrected as shown below:

Title page, item [54], and col. 1, title should read--
METHOD FOR DETECTING REMAINING
BATTERY CAPACITY BY
CONTINUOUSLY MONITORING CURRENT,
VOLTAGE, AND TEMPERATURE Signed and Sealed this Eighteenth Day of November 1997

Attest:

BRUCE LEHMAN

Attesting Officer

Commissioner of Patents and Trademarks